US007328396B2

(12) United States Patent
Mann

(10) Patent No.: US 7,328,396 B2
(45) Date of Patent: Feb. 5, 2008

(54) CYCLIC REDUNDANCY CHECK GENERATING CIRCUIT

(75) Inventor: Gregory J. Mann, Winfield, IL (US)

(73) Assignee: International Business Machines Corporation, Armonk, NY (US)

( * ) Notice: Subject to any disclaimer, the term of this patent is extended or adjusted under 35 U.S.C. 154(b) by 544 days.

(21) Appl. No.: 10/709,794

(22) Filed: May 28, 2004

(65) Prior Publication Data

US 2005/0268209 A1 Dec. 1, 2005

(51) Int. Cl.
 *H03M 13/00* (2006.01)
(52) U.S. Cl. .................. 714/781; 714/776; 714/798; 714/779
(58) Field of Classification Search ........... 714/781, 714/776, 758, 807, 757, 775, 798, 779
 See application file for complete search history.

(56) References Cited

U.S. PATENT DOCUMENTS 3,678,469 A * 7/1972 Freeman et al. ............ 714/779
4,593,393 A * 6/1986 Mead et al. ................ 714/757
5,130,991 A * 7/1992 Takano ...................... 714/757
5,267,249 A * 11/1993 Dong ........................ 714/775
5,619,516 A * 4/1997 Li et al. ..................... 714/807
5,771,249 A * 6/1998 Yanagisawa ................ 714/798
5,844,923 A * 12/1998 Condon ..................... 714/798

* cited by examiner

*Primary Examiner*—Jacques Louis-Jacques
*Assistant Examiner*—Fritz Alphonse
(74) *Attorney, Agent, or Firm*—Schmeiser, Olsen & Watts; Anthony J. Canale

(57) ABSTRACT

A circuit, a method, and a method of designing the circuit, the circuit including: multiple W-bit packet data slice latches; a data partition comprising multiple data XOR subtree levels and having data latches between the data XOR subtree levels; a remainder partition comprising multiple remainder XOR subtree levels and having remainder latches between the remainder XOR subtree levels; a combinatorial XOR tree, outputs of the remainder partition and outputs of the data partition connected to inputs of the combinatorial XOR tree; and a remainder latch, combinatorial XOR tree connected to the remainder latch and the outputs of the remainder latch connected to the remainder partition.

30 Claims, 15 Drawing Sheets

CYCLIC REDUNDANCY CHECK GENERATING CIRCUIT

BACKGROUND OF INVENTION

1. Field of the Invention

The present invention relates to the field of cyclic redundancy check circuits; more specifically, it relates to a fully pipelined cyclic redundancy check circuit.

2. Background of the Invention

Error checking of data transmissions between sending and receiving devices use a cyclic redundancy check circuit (CRC) implementing various CRC codes in both the sending and receiving devices. The CRC code is calculated by an exclusive OR (XOR) subtree. As high speed serial interconnect technologies evolve, many of the standards governing these technologies allow bandwidths well beyond the traditional 96 and 128 bits per cycle bandwidths, yet maintain the same transmission frequency as for the older smaller 96 and 128 bits per cycle bandwidths. As bandwidth increases, the complexity and depth of the XOR subtree must increase as the need to process more bits per clock cycle grows. Traditional CRC designs when applied to large bandwidth data transmissions very quickly develop the interrelated problems of increased processing time and physical silicon area required to implement the XOR subtree. Therefore, there is a need for a more efficient CRC circuit than presently available.

SUMMARY OF INVENTION

A first aspect of the present invention is a circuit, comprising: multiple W-bit packet data slice latches each having inputs and outputs, the packet data slice latches connected in series from a first to a last packet data slice latch, outputs of a previous packet data slice latch connected to inputs of an immediately subsequent packet data slice latch; a data partition comprising multiple data XOR subtree levels and having data latches between the data XOR subtree levels, the data partition having inputs and outputs, the outputs of each packet data slice latch connected to corresponding inputs of the data partition; a remainder partition comprising multiple remainder XOR subtree levels and having remainder latches between the remainder XOR subtree levels, the remainder partition having inputs and outputs; a combinatorial XOR tree having inputs and outputs, the outputs of the remainder partition and the outputs of the data partition connected to corresponding inputs of the combinatorial XOR tree; and an M-bit current cyclic redundancy check (CRC) remainder latch having inputs and outputs, the output of the combinatorial XOR tree connected to corresponding inputs of the current CRC remainder latch and the outputs of the current CRC remainder latch connected to corresponding inputs of the remainder partition.

A second aspect of the present invention is a method, providing multiple W-bit packet data slice latches each having inputs and outputs, the packet data slice latches connected in series from a first to a last packet data slice latch, outputs of a previous packet data slice latch connected to inputs of an immediately subsequent packet data slice latch; providing a data partition comprising multiple data XOR subtree levels and having data latches between the data XOR subtree levels, the data partition having inputs and outputs, the outputs of each packet data slice latch connected to corresponding inputs of the data partition; providing a remainder partition comprising multiple remainder XOR subtree levels and having remainder latches between the remainder XOR subtree levels, the remainder partition having inputs and outputs; providing a combinatorial XOR tree having inputs and outputs, the outputs of the remainder partition and the outputs of the data partition connected to the inputs of the combinatorial XOR tree; and providing an M-bit current cyclic redundancy check (CRC) remainder latch having inputs and outputs, the output of the combinatorial XOR tree connected to the inputs of the current CRC remainder latch and the outputs of the current CRC remainder latch to the inputs of the remainder partition.

A third aspect of the present invention is a method of designing a circuit, the method comprising: (a) providing a cyclic redundancy check (CRC) circuit design for a current CRC remainder, comprising: outputs of a packet data slice latch connected to inputs of a data XOR tree; outputs of a current CRC remainder latch connected to inputs of a remainder XOR tree; and outputs of the data XOR tree and outputs of the remainder XOR tree coupled to corresponding inputs of the current CRC remainder latch through a combinatorial XOR tree; (b) substituting a previous CRC cycle data and corresponding previous CRC remainder for the current CRC remainder or for a previously substituted CRC remainder and adding an additional packet data slice latch, an additional CRC remainder latch, an additional data XOR tree, an additional remainder XOR tree and an additional combinatorial XOR tree to the CRC circuit design without altering the a CRC remainder result of the CRC circuit design; (c) partitioning all packet data slice latches and all data XOR trees into a data partition and all additional current CRC remainder latches and all remainder XOR trees into a remainder partition; (d) combining all remainder XOR trees into a single remainder XOR tree and combining all data XOR trees into a single data XOR tree; (e) repeating steps (b) through (c) a predetermined number of times; and (f) distributing the single remainder XOR tree in the remainder partition over two or more remainder XOR subtree levels, distributing all additional CRC remainder latches over one or more and remainder latch levels, distributing the single data XOR trees in the data partition over two or more data XOR subtree levels and distributing all additional packet data slice latches over one or more data latch levels.

A fourth aspect of the present invention is a method of designing a circuit, the method comprising: (a) distributing a current cyclic redundancy check (CRC) remainder XOR calculation of an M-bit redundancy check circuit into a remainder partition comprising multiple levels of remainder XOR subtrees and having remainder latches between the levels of remainder XOR subtrees; and (b) distributing a packet data slice XOR function of the M-bit redundancy check circuit into a data partition of comprising multiple levels of data XOR subtrees and having data latches between the levels of data XOR subtrees.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

The present invention is related to pending patent application Ser. No. 10/729,277 filed on Dec. 4, 2003 which is hereby incorporated by reference in its entirety.

The terminology Q by P-way XOR subtree defines an XOR subtree having Q outputs and (P×Q) inputs. The notation Q^P should be read as $Q^P$. Pipelining is a method of processing on a computer that allows fast parallel processing of data. In a fully pipelined CRC circuit, this means parallel processing of both the packet data slice and the CRC remainder simultaneously. The term level may be read as stage.

An XOR operation is defined herein and in the claims as a logical operation over an arbitrary number of binary inputs with a single binary output. The logical operation results in a logical 1 when an odd number of inputs are logical ones and the rest of the inputs are logical zero, else the output is a logical zero. An XOR gate is defined herein and in the claims as a circuit that implements an XOR operation. An XOR level is defined herein and in the claims as an acyclic (not cyclic) network of XOR gates with an arbitrary number of binary inputs and an arbitrary number of outputs. The inputs of the XOR gates are connected to outputs of a first set of latches. The outputs of the XOR gates are connected to inputs of a second set of latches.

Figure 1:
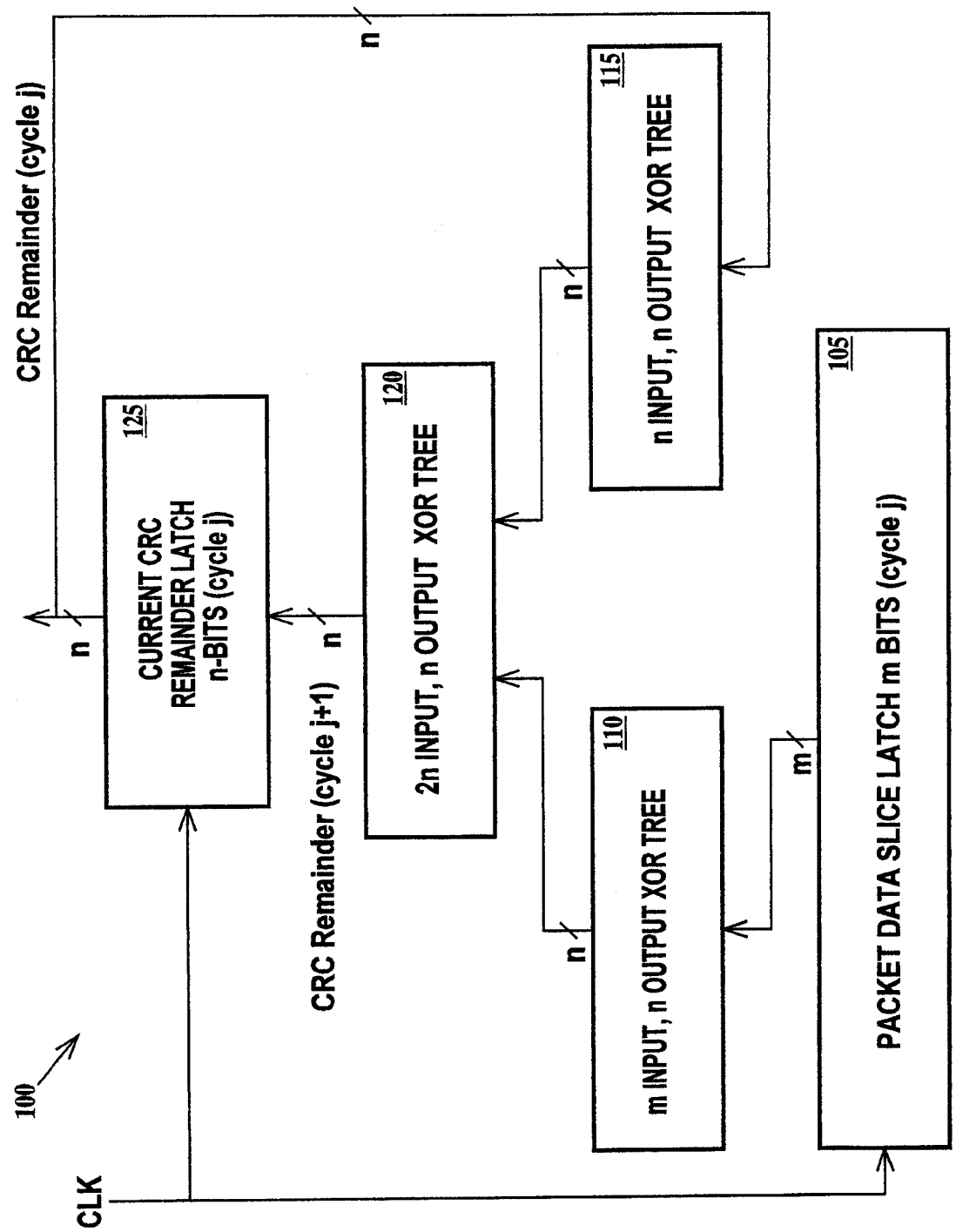
FIG. 1 is an exemplary m-bit CRC circuit.

FIG. 1 is an exemplary m-bit CRC circuit. In FIG. 1, a CRC circuit 100 includes an m-bit packet data slice latch 105 (latching the cycle j data packet slice), a single, m-bit input/n-bit output data XOR tree 110 and an n-input/n-output remainder XOR tree 115, a 2n-input/n-output combinatorial XOR tree 120 (generating the cycle j+1 remainder) and an n-bit current CRC remainder latch 125 (latching the cycle j remainder). The bit width of remainder latch 125 defines the CRC type, in the present example an n-bit CRC. The outputs of packet slice latch 105 are connected to the inputs of data XOR tree 110 by an m-bit bus; each bit connected to a different input. The outputs of data XOR subtree 110 are connected a first set of n-inputs of combinatorial XOR tree 120 by an n-bit bus, each bit connected to a different input. The outputs of remainder XOR subtree 115 are connected to a second set of n-inputs of combinatorial XOR tree 120 by an n-bit bus, each bit connected to a different input. The outputs of combinatorial XOR subtree 120 are connected to the inputs of current CRC remainder latch 115 by an n-bit bus, each bit connected to a different input. The outputs of current CRC remainder latch 115 are connected to the inputs of remainder XOR tree 115 by an n-bit bus, each bit connected to a different input, thus providing the cyclic portion of the CRC result.

Data bits are moved from packet data slice latch 105 and through data XOR tree 110 and combinatorial XOR tree 120 into current CRC latch 125 by a clock signal CLK. Remainder bits are cycled from current CRC remainder latch 125, through remainder XOR tree 115 and combinatorial XOR tree 120 and back to the current CRC remainder latch by clock signal CLK. The arrangement of XOR gates in XOR tree 110 implements the CRC code and performs the actual CRC calculation.

As the number of input bits to an XOR tree increases, the depth of XOR gates (the number of XOR gates connected in series from the input to the output of the XOR tree) as well as the number of inputs in each individual XOR gate in the XOR tree increases. At some point, it will take more than a single clock cycle for data bits to travel through the data XOR tree and remainder bits to travel through the remainder XOR tree and the CRC circuit will generate an erroneous CRC result. The present invention avoids XOR tree data bit propagation time problems by partitioning both the data XOR tree and the remainder XOR-tree into levels, each level small enough not to have a data bit propagation time problem and to avoid the data bit path or the remainder bit path gating the CRC operation. It should be noted that data bit and remainder bit propagation time is dependent on the integrated circuit technology that the CRC circuit is physically fabricated in.

The first partition is a set of XOR subtrees and latches for processing the data bits and the second is a set of XOR subtrees and latches for processing the remainder bits of the CRC. Both partitions are multi-level partitions, each level comprised of multiple XOR subtrees and latches. Each XOR subtrees of the data partition is no slower than the slowest XOR subtree in the remainder partition Each level of XOR subtrees perform a portion of the CRC calculation and each XOR subtree belonging to a particular level performs a portion of the portion of the CRC calculation performed by the level. The size of the largest remainder subtree is chosen so that all the XOR calculation it performs can be completed in one clock cycle at the desired frequency. Since all the XOR subtrees of the data partition and the remainder partition are no slower than the slowest remainder XOR subtree, each data partition levels portion of the CRC is likewise performed in one clock cycle or less.

FIGS. 2 through 7 illustrate a set of logical steps applied to CRC circuit 100 of FIG. 1 in developing a CRC circuit of the present invention. The remainder for any given cycle is the result of the same set of XOR operations performed on the previous remainder and previous data. In FIG. 1, the remainder for cycle j+1 was the result of XOR operations on the data packet slice for cycle j and the remainder for cycle j. The remainder for cycle j can be expressed as the same XOR operations performed on the data packet slice for cycle j−1 and the remainder for cycle j−1. An XOR operation is in reality a mathematical calculation and just as mathematical calculations make use of substitutions, the XOR tree operations can be substituted.

Figure 2:
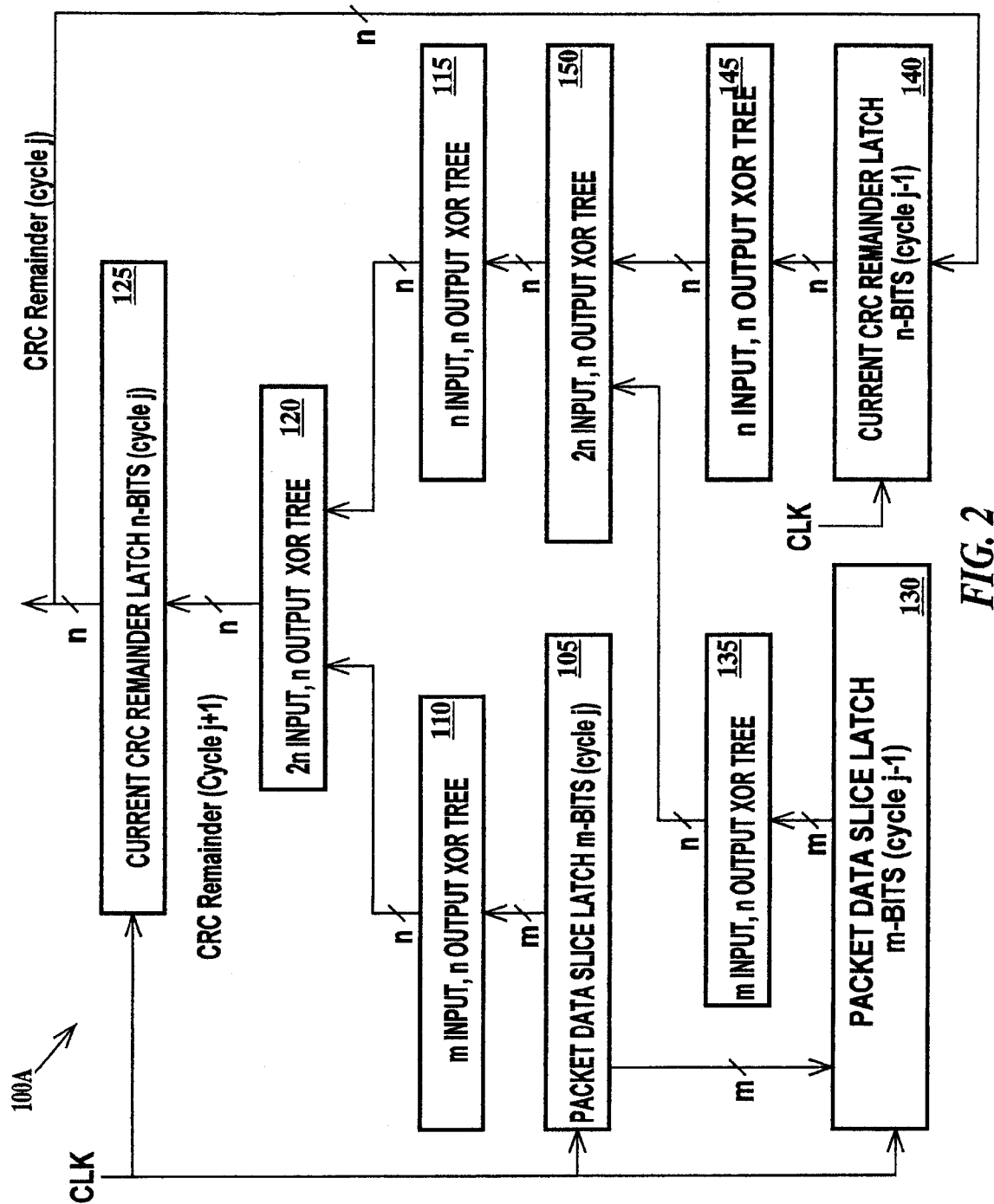
FIGS. 2 through 7 illustrate a set of logical steps applied to CRC circuit 100 of FIG. 1 in developing a CRC circuit of the present invention.

Thus in FIG. 2, the j−1 cycle has been substituted for the j cycle to create a CRC circuit 100A which is functionally identical to CRC circuit 100 of FIG. 1, though its operation might be slightly slower. However, in FIG. 2, an m-bit packet data slice latch 130 (latching the cycle j−1 data packet slice), an m input/n-output data XOR tree 135, an n-bit current CRC remainder latch 140 (latching the cycle j−1 remainder), an m-input/n-output remainder XOR tree and a 2n-input/n-output combinatorial XOR tree 150 have been added. Data XOR trees 110 and 135 have about the same XOR gate count and remainder XOR trees 115 and 145 have about the same XOR gate count, so the overall XOR gate count of CRC 100A is greater than that of CRC circuit 100 of FIG. 1.

Interconnections in FIG. 2 are the same as in FIG. 1 except for the following: The outputs of current CRC remainder latch 125 are connected to the inputs of current CRC remainder latch 140, by an n-bit bus, each bit connected to a different input. The outputs of current CRC remainder latch 140 are connected to the inputs of remainder XOR tree 145, by an n-bit bus, each bit connected to a different input. The outputs of remainder XOR tree 145 are connected to a first set of n-inputs of combinatorial XOR tree 150 by an n-bit bus, each bit connected to a different input. The outputs of packet data slice latch 105 are connected to the inputs of current data packet slice latch 130, by an m-bit bus, each bit connected to a different input (in addition to the previous connection to data XOR tree 110). The outputs of packet data slice latch 130 are connected to the inputs of data XOR tree 135, by an n-bit bus, each bit connected to a different input. The outputs of data XOR tree 155 are connected to a second set of n-inputs of combinatorial XOR tree 150 by an n-bit bus, each bit connected to a different input.

Figure 3:
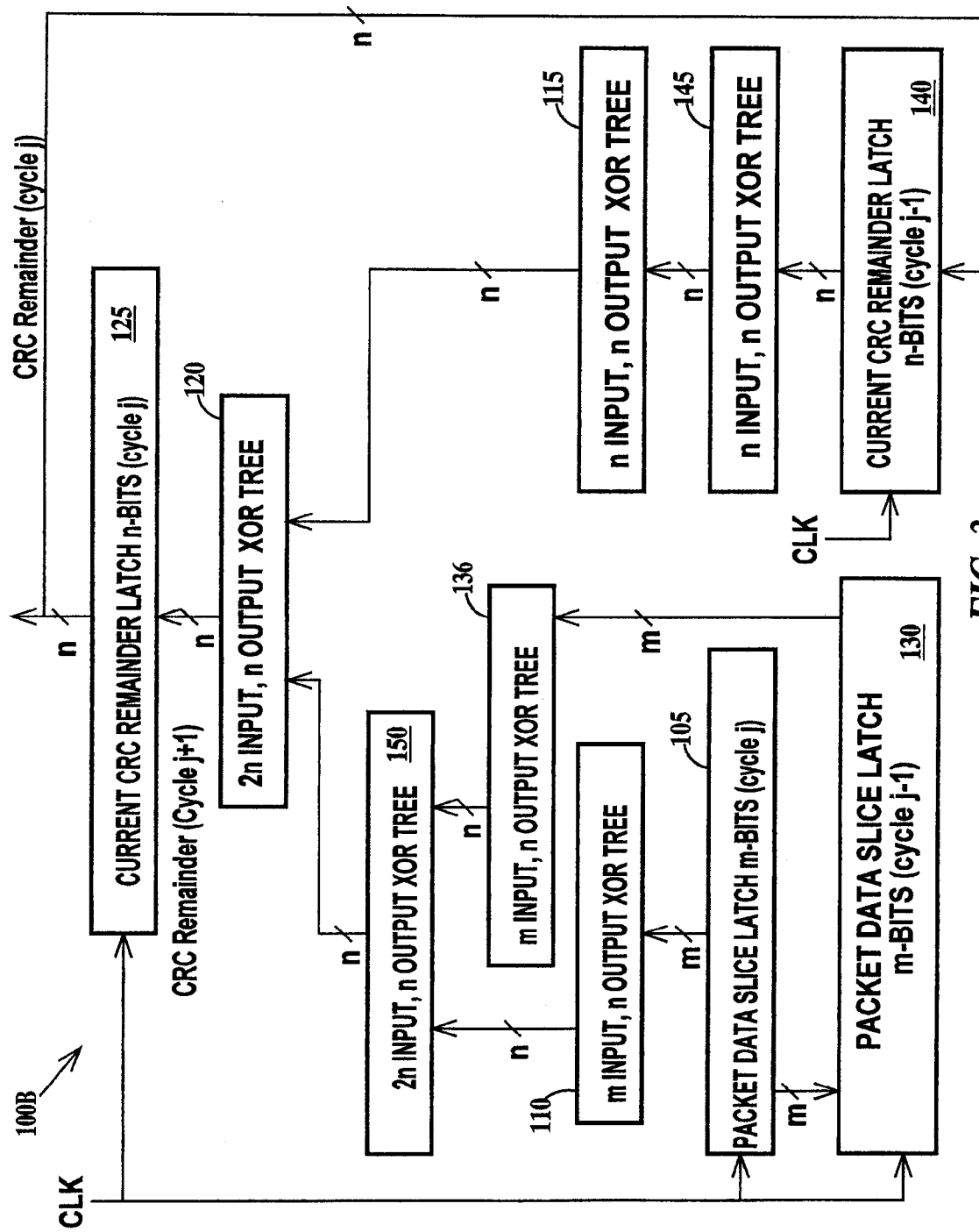

In FIG. 3, a CRC circuit 100B is functionally identical to CRC circuit 100A of FIG. 2 and has nearly the same identical XOR tree and latch elements. However, the interconnections between some elements have been rearranged topographically in order to cascade the XOR trees. The XOR function of remainder XOR tree 115 is applied to data XOR tree 135 of FIG. 2 to create data XOR tree 136 of FIG. 3. In FIG. 3, combinatorial XOR tree 120 and remainder XOR trees 115 and 145 are cascaded, combinatorial XOR trees 120 and 150 and data XOR trees 110 are cascaded between current CRC remainder latch 125 and current CRC remainder latch 140, combinatorial XOR trees 120 and 150 and data XOR tree 136 are cascaded between current CRC remainder latch 125 and packet data slice latch 130, and combinatorial XOR trees 120 and 150 and data XOR tree 110 are cascaded between current CRC remainder latch 125 and packet data slice latch 130. Cascaded is defined as serially connected levels (an XOR tree is a level in this context), the output of a previous level connected to the input of a subsequent level in the series of levels.

Figure 4:
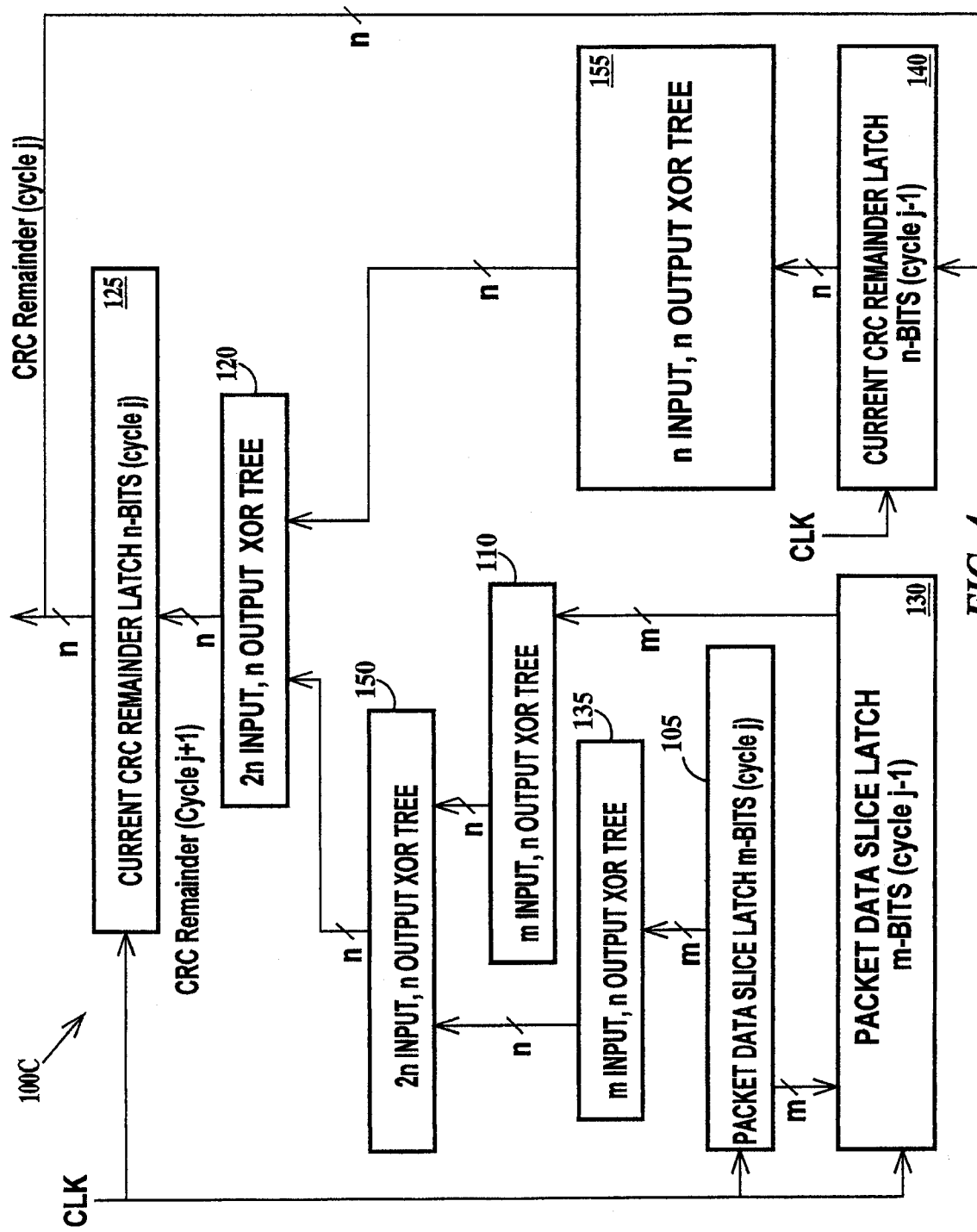

In FIG. 4, a CRC circuit 100C is functionally identical to CRC circuit 100B of FIG. 3 and has the same identical XOR tree and latch elements and connections between XOR tree and latch elements except remainder XOR trees 115 and 145 of CRC 100B of FIG. 2 have been combined into a single remainder XOR tree 155. Remainder XOR tree 155 is about the same size (same XOR gate count) as either remainder XOR tree 115 or 145 of FIG, 2. Therefore the gate count has been reduced in CRC 100C from that of CRC 100B of FIG. 3.

Figure 5:
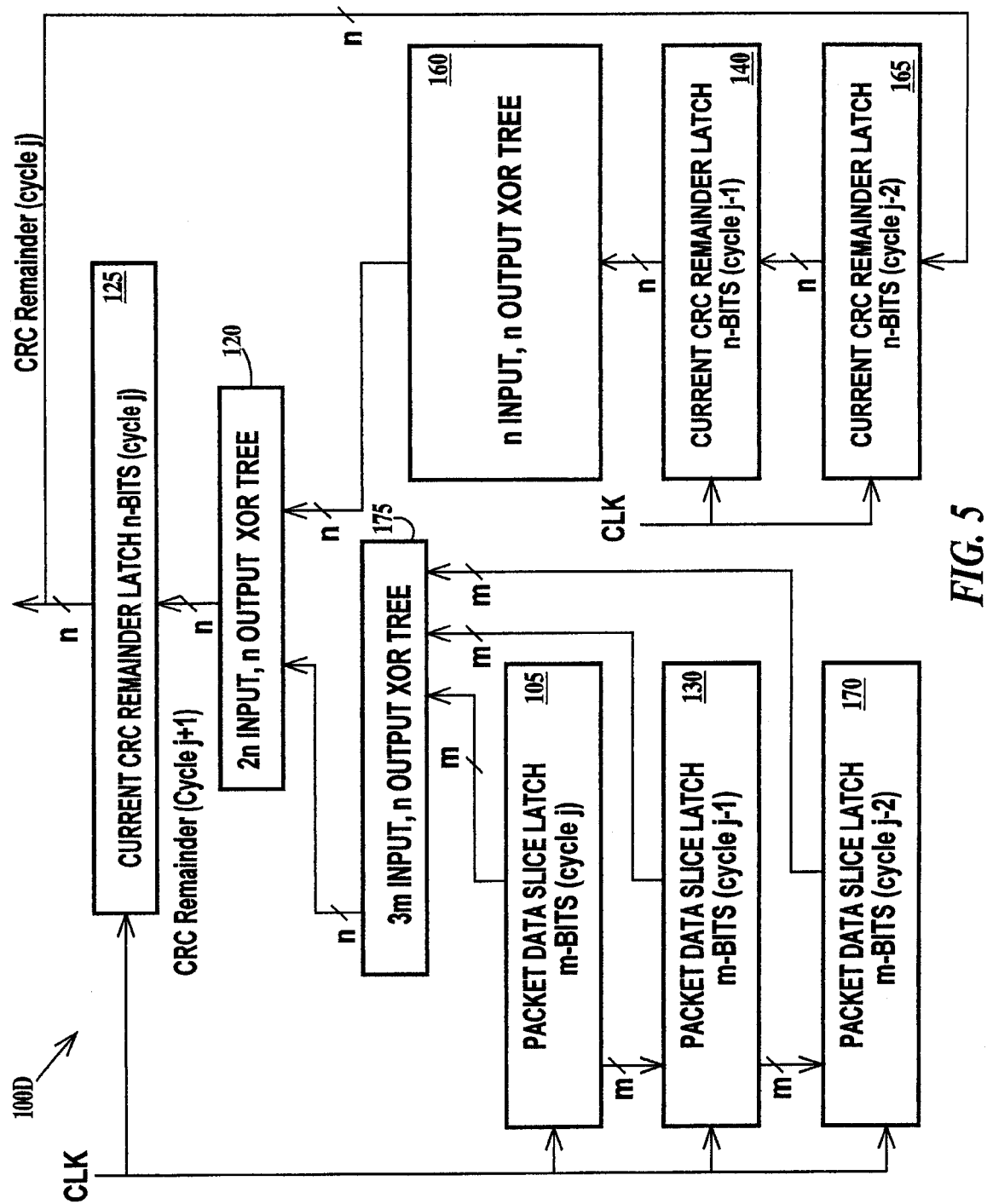

In FIG. 5, a CRC circuit 100D has been derived from CRC circuit 100 of FIG. 1 by the same process as CRC circuit 100C of FIG. 4 was derived except that the j–2 cycle has been included. In FIG. 5, the outputs of current CRC remainder latch 125 for (latching the cycle j remainder) are connected to the inputs of a current CRC remainder latch 165 (latching the cycle j–2 remainder) by an n-bit bus, each bit connected to a different input. The outputs of current CRC remainder latch 165 are connected to the inputs of current CRC remainder latch 140 (latching the cycle j–1 remainder) by an n-bit bus, each bit connected to a different input. The outputs of current CRC remainder latch 140 are connected to the inputs of current CRC remainder latch 140 by an n-bit bus, each bit connected to a different input. The outputs of current CRC remainder latch 140 are connected to the inputs of an n-input/n-output remainder XOR tree 160 by an n-bit bus, each bit connected to a different input. The outputs of current CRC remainder latch 160 are connected to a first set of inputs of 2n-input/n-output XOR tree 120 (shown generating the cycle j+1 remainder) by an n-bit bus, each bit connected to a different input. The gate count of remainder XOR tree is about same as that of remainder XOR tree 115 of FIG. 1, saving about ⅔ of the total XOR gate count required. In general any number of XOR trees can be merged with the resultant XOR tree having about the same number of XOR gates as any of the pre-merged XOR trees.

Continuing with FIG. 5, the outputs of a packet data slice latch 170 (latching the cycle j–2 packet data slice) are connected to a first set of inputs of a 3m-input/n-output data XOR tree 175 by an m-bit bus, each bit connected to a different input. The outputs of packet data slice latch 130 (latching the cycle j–1 packet data slice) are connected to a second set of inputs of 3m-input/n-output data XOR tree 175 by an m-bit bus, each bit connected to a different input. The outputs of packet data slice latch 105 (latching the cycle j packet data slice) are connected to a third set of inputs of 3m-input/n-output data XOR tree 175 by an m-bit bus, each bit connected to a different input. The XOR gate count of data XOR tree 175 is about three times that of data XOR tree 110 of CRC circuit 100 of FIG. 1. The outputs of data XOR tree 175 are connected to a second set of inputs of combinatorial XOR tree 120 by an m-bit bus, each bit connected to a different input.

Figure 6:
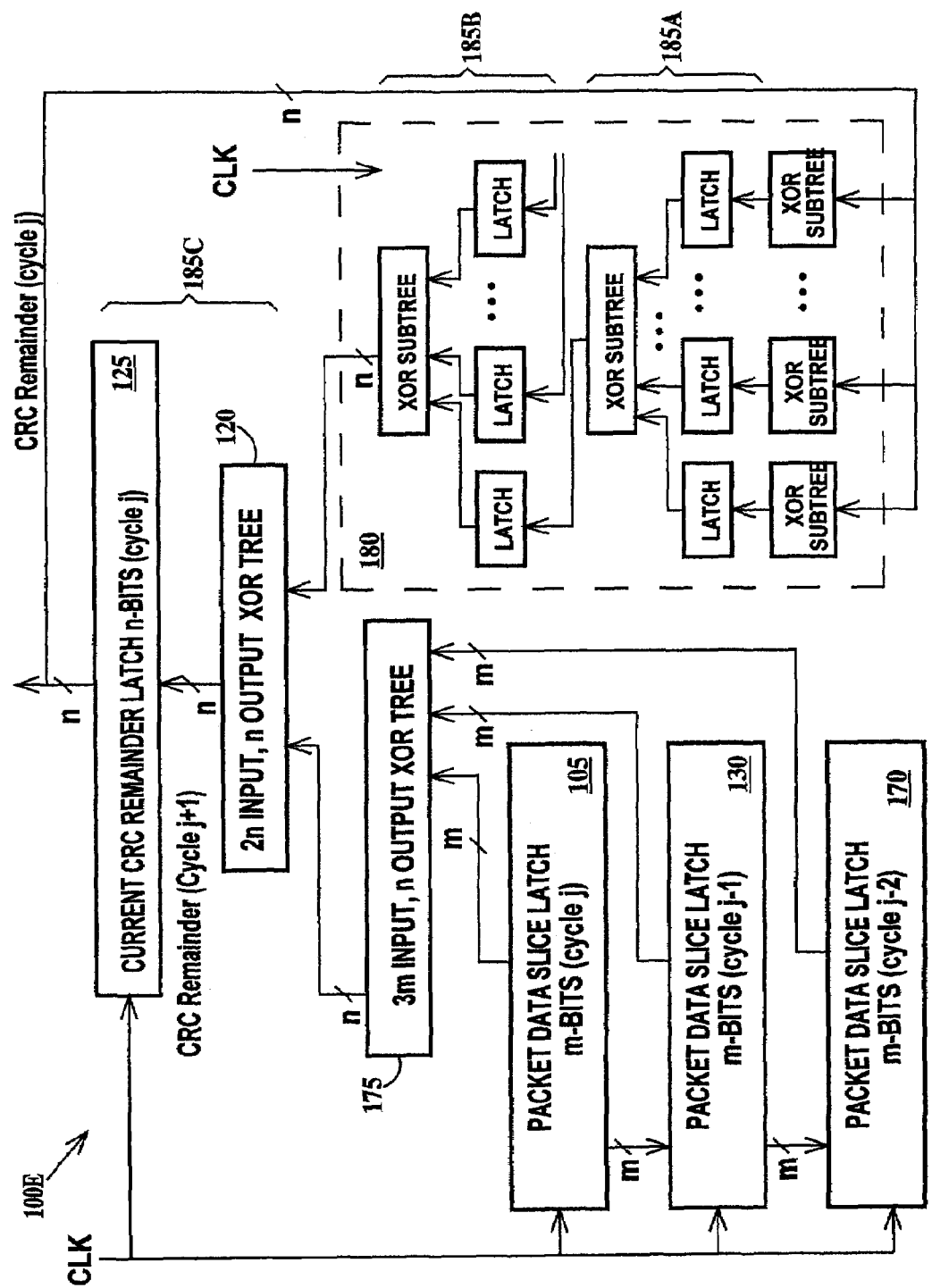

In FIG. 6, a CRC circuit 100E has been generated by redistribution of current CRC remainder latches 140 and 165 and remainder XOR tree 160 of CRC circuit 100D of FIG. 5, into two latch/XOR subtree levels 185A and 185B of smaller XOR trees and remainder latches as illustrated in remainder partition 180. Each XOR subtree has a significantly smaller XOR gate count than remainder XOR tree 160 of CRC circuit 100D of FIG. 5 and thus while CRC circuit 100E is functionally identical to CRC circuit 100 of FIG. 1, the time to perform the CRC remainder calculation is significantly less for CRC circuit 100E. The method of partitioning remainder partition 180 is described infra. The total number of latch/XOR levels is equal to the number of cycles substituted. For CRC circuit 100E there were 3 cycles (j, j–1 and j–2) and there are three latch/XOR levels, 185A, 185B and 185C, latch/XOR level 185C including combinatorial XOR tree 120 and current CRC remainder latch 125.

Figure 7:
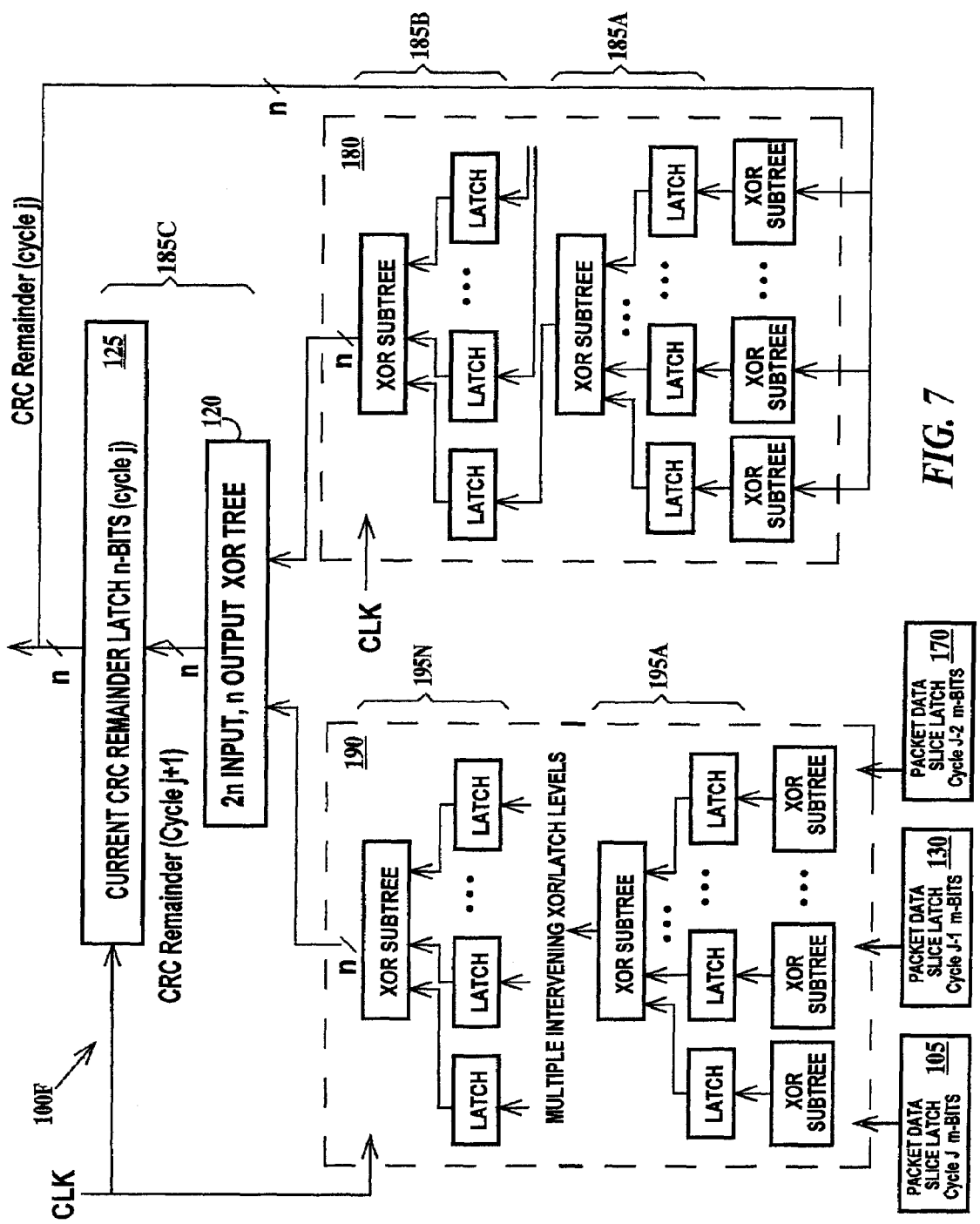

In FIG. 7, a CRC circuit 100F has been generated by partitioning of XOR tree 175 of CRC circuit 100E into multiple latch/XOR subtree levels 195A through 195N of smaller XOR trees and remainder latches as illustrated in data partition 190. Each XOR subtree has a significantly smaller XOR gate count than data XOR tree 175 of CRC circuit 100E of FIG. 6 and thus while CRC circuit 100F is functionally identical to CRC circuit 100 of FIG. 1, the time to perform the CRC remainder calculation as well as process the packet data slices is significantly less for CRC circuit 100E. The method of partitioning data partition 190 is described infra. The data partition XOR subtrees are designed so that no latch/XOR subtree has a greater depth of XOR gates (there may be multiple cascaded XOR gates in an XOR subtree) than the depth of XOR gates in any latch/XOR level in remainder partition 180. The upper bound of the number of XOR gates is fixed, regardless of the number of previous cycles extracted. For example, for CRC circuits implementing 32 CRC calculations, the XOR subtree will never have more than 32 bits. If 5 previous cycles are used to design the CRC circuit, then the CRC circuit can be implemented with just a single XOR2 gate in each level of the remainder partition.

An initial value must for the current CRC remainder must be supplied. Given the CRC circuit structures described supra, in reference to FIGS. 6 and 7, the CRC remainder for cycle j=1 is determined by the value of the packet data slice for cycle j, the value of the packet data slice for cycle j−1 through the value of the packet data slice for cycle j−(a−1) where a is the number of cycles the CRC circuit is based on. In the example of CRC circuits 100E and 100F of FIGS. 6 and 7 respectively, a=3.

The first a−1 cycles of packet data slices will require knowing the CRC remainders for cycles prior to the initial (0) cycle. The CRC remainder of the initial cycle is a predetermined value, in one example all 1"s. CRC remainders of cycles prior to the initial cycle can be computed by arbitrarily picking data slice values prior to the initial cycle, for example, all 0"s, and computing what CRC remainder values would be required for cycles −1 to −(a−1) to produce a cycle 0 remainder of the predetermined initial value. This can be accomplished by in a software program by inverting the function that computes CRC remainders serially (i. e. one bit at a time). With the inverted function, the CRC remainder is set to the initial value, and a set of w 0-bits are fed into the inverted function. This computes the CRC remainder for cycle −1. For each set of w 0-bits fed into the inverted function, another remainder cycle value is computed.

Once the initial CRC remainder values have been computed, the XOR operations in the remainder partition must be applied to the values such that for a given latch level a-c, (c=the cycle of interest) all XOR operations starting at the current CRC remainder latch for level 0 and level a-c are applied to the initial CRC value for cycle −c. An example of a PERL program for performing (for a=3) the aforementioned calculations is given in Table I.

TABLE 1

PROGRAM FOR CALCULATING INITIAL CRC REMAINDER#!/usr/bin/perl

```
$num_cycles_back = 3;
$num_bits_per_cycle = 192;
for ($i = 0; $i < 32; $i = $i + 1) {
$init_y[$i] = "1";
}
for($j = 0; $j < $num_cycles_back; $j++) {
for($i = 0; $i < $num_bits_per_cycle; $i++) {
#REVERSE THE LFSR OPERATION
$tmp_y[30] = $init_y[31];
$tmp_y[29] = $init_y[30];
$tmp_y[28] = $init_y[29];
$tmp_y[27] = $init_y[28];
$tmp_y[26] = $init_y[27];
$tmp_y[25] = eval_xor_it($init_y[26], $init_y[0]);
$tmp_y[24] = $init_y[25];
$tmp_y[23] = $init_y[24];
$tmp_y[22] = eval_xor_it($init_y[23], $init_y[0]);
$tmp_y[21] = eval_xor_it($init_y[22], $init_y[0]);
$tmp_y[20] = $init_y[21];
$tmp_y[19] = $init_y[20];
$tmp_y[18] = $init_y[19];
$tmp_y[17] = $init_y[18];
$tmp_y[16] = $init_y[17];
$tmp_y[15] = eval_xor_it($init_y[16], $init_y[0]);
$tmp_y[14] = $init_y[15];
$tmp_y[13] = $init_y[14];
$tmp_y[12] = $init_y[13];
$tmp_y[11] = eval_xor_it($init_y[12], $init_y[0]);
$tmp_y[10] = eval_xor_it($init_y[11], $init_y[0]);
```

TABLE 1-continued

PROGRAM FOR CALCULATING INITIAL CRC REMAINDER#!/usr/bin/perl

```
$tmp_y[9] = eval_xor_it($init_y[10], $init_y[0]);
$tmp_y[8] = $init_y[9];
$tmp_y[7] = eval_xor_it($init_y[8], $init_y[0]);
$tmp_y[6] = eval_xor_it($init_y[7], $init_y[0]);
$tmp_y[5] = $init_y[6];
$tmp_y[4] = eval_xor_it($init_y[5], $init_y[0]);
$tmp_y[3] = eval_xor_it($init_y[4], $init_y[0]);
$tmp_y[2] = $init_y[3];
$tmp_y[1] = eval_xor_it($init_y[2], $init_y[0]);
$tmp_y[0] = eval_xor_it($init_y[1], $init_y[0]);
$tmp_y[31] = $init_y[0];
# last bit is serial out, must be 1
for($k = 0; $k < 32; $k = $k + 1) {
$init_y[$k] = $tmp_y[$k];
}
}
for ($l = 0; $l < 32; $l++) {
$initial_val[$j][$l] = $init_y[$l];
}
}
for ($m = 0; $m < $num_cycles_back; $m++) {
for ($i = 0; $i < 32; $i++) {
$init_rev_y[31 − $i] = $initial_val[$m][$i];
}
$init_val = join "", @init_rev_y;
$init_val = oct("0b$init_val");
printf("%0d cycles back: %0x\n",($m + 1),$init_val);
}
sub eval_xor_it {
$op1 = shift(@_);
$op2 = shift(@_);
if ($op1 eq "0") {
return $op2;
} else {
return ($op2 eq "1")?"0":"1";
}
}
```

Figure 8:
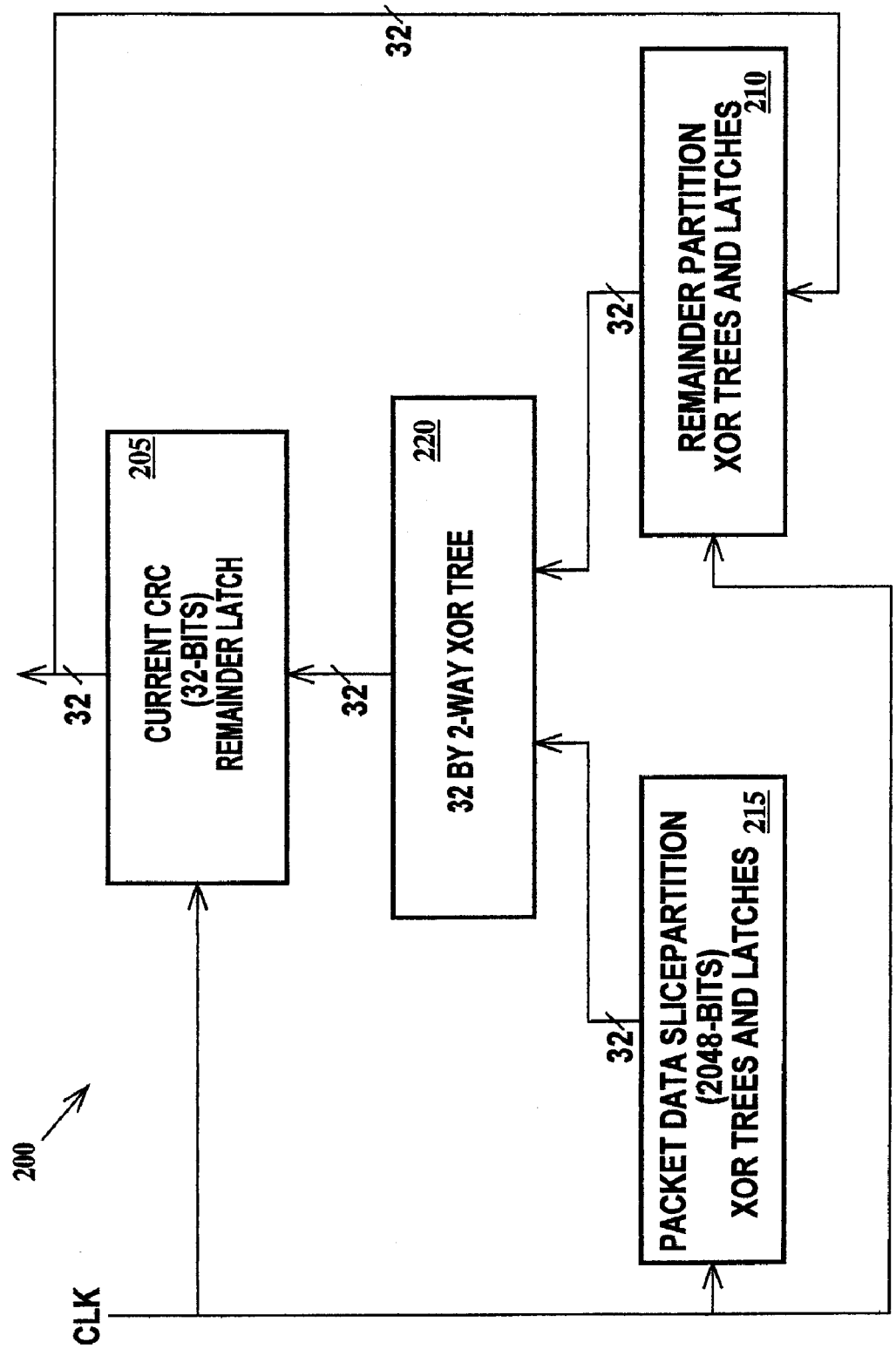
FIG. 8 is an exemplary 32-bit CRC circuit according to the present invention.

FIG. 8 is an exemplary 32-bit CRC circuit according to the present invention. In FIG. 8, a CRC circuit 200 includes a 32-bit current CRC remainder latch 205, a 32-bit remainder partition 210, a 2048-bit packet data slice partition 215 and a 32 by 2-way combinatorial XOR tree 220. The outputs of current CRC remainder latch 205 are connected to the inputs of remainder partition 210 by a 32-bit bus, each bit connected to a different input. The outputs of remainder partition 210 are connected to a first set of inputs of combinatorial XOR tree 220 by a 32-bit bus, each bit connected to a different input. The outputs of packet data slice partition 215 are connected a second set of inputs of combinatorial XOR tree 220 by a 32-bit bus, each bit connected to a different input. The outputs of combinatorial XOR tree 220 are connected to the inputs of current CRC remainder latch 205 by a 32-bit bus, each bit connected to a different input.

Figure 9:
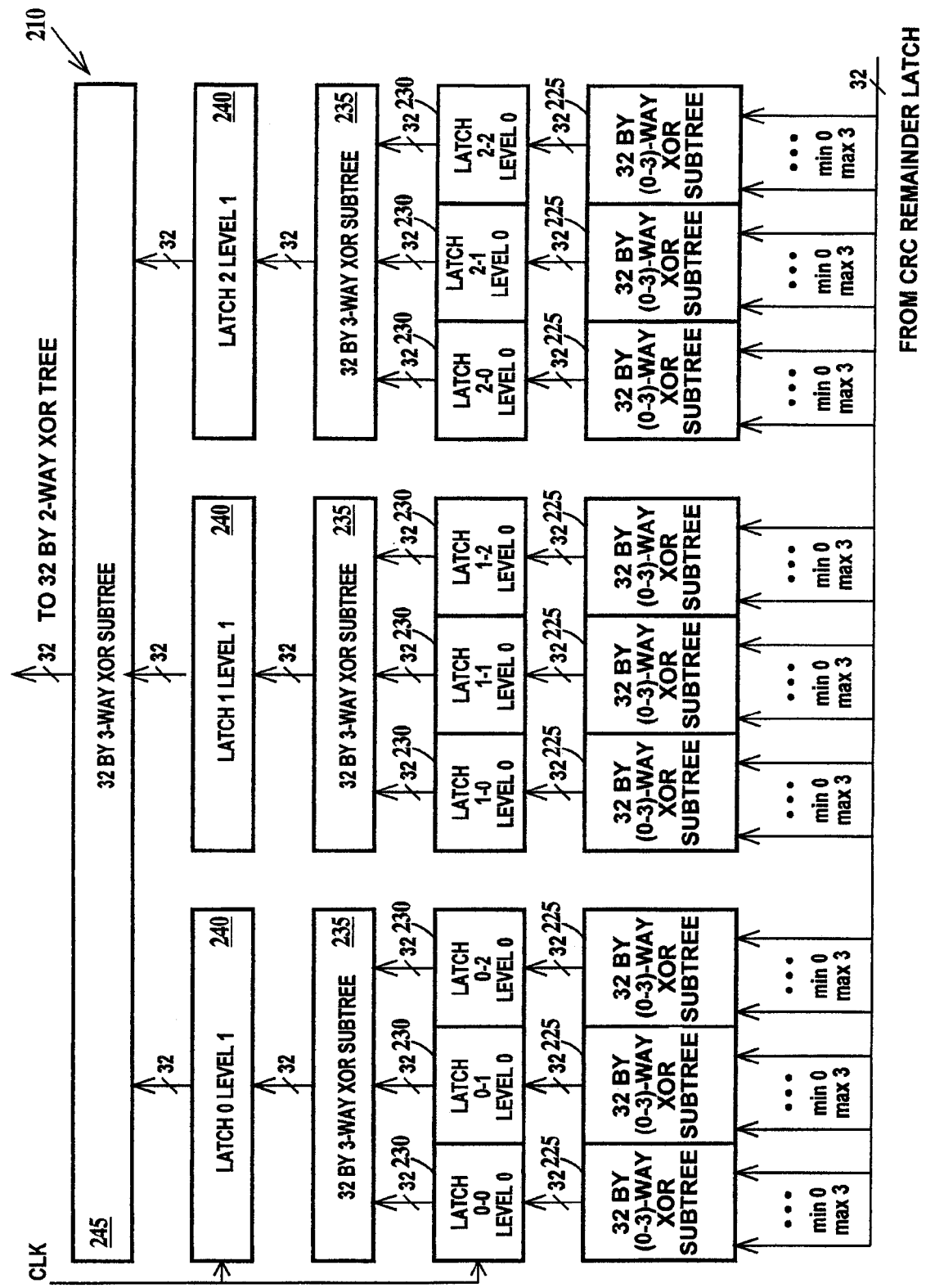
FIG. 9 is a schematic circuit diagram of a remainder partition of the CRC circuit of FIG. 8.

FIG. 9 is a schematic circuit diagram of remainder partition 210 of CRC circuit 200 of FIG. 8. In FIG. 9, remainder partition 210 includes nine 32 by (0-3) XOR subtrees 225 arranged in sets of 3, and corresponding 32-bit latches 230, three sets of 32 by 3-way XOR subtrees 235 and corresponding 32-bit latches 240, and a 32 by 3-way XOR subtree 245. Latches 225 are partition level 0 latches, and latches 240 are partition level 1 latches.

Each XOR subtree 225 is connected to current CRC remainder CRC latch 205 (see FIG. 8) by 0 to 3, 32-bit inputs. Each of the 32 outputs of each XOR subtree 225 is connected to a different input of a corresponding latch 215. There need not be any particular relationship between a particular input of a particular XOR subtree 225 and a particular bit from remainder CRC latch 205 (see FIG. 8). Each of the 32 outputs of each latch 230 in each set is connected to a different input of a different 32 input set of the 96 inputs of a corresponding XOR subtree 235. Each of the 32 outputs of each XOR subtree 240 is connected to a different input of a 32 input set of the 96 inputs of XOR subtree 235. Each of the 32 outputs of each XOR subtree 235 is connected to a different input of a corresponding latch 245. The 32 outputs of each latch 240 are connected to a different input of a 32 input set of the 96 inputs of XOR subtree 245.

Remainder bits are moved from remainder CRC latch 205 (see FIG. 8) through XOR subtrees 225 into latches 230 by clock signal CLK. Remainder bits are moved from latches 230 through XOR subtrees 235 and into latches 240 by clock signal CLK. Remainder bits are moved from latches 240, through XOR subtree 245 into combinatorial XOR tree 220 (see FIG. 8) by clock signal CLK. The specific arrangement of XOR gates in XOR trees 210, 235 and 225 implements the CRC code and performs the actual CRC calculation.

Figure 10:
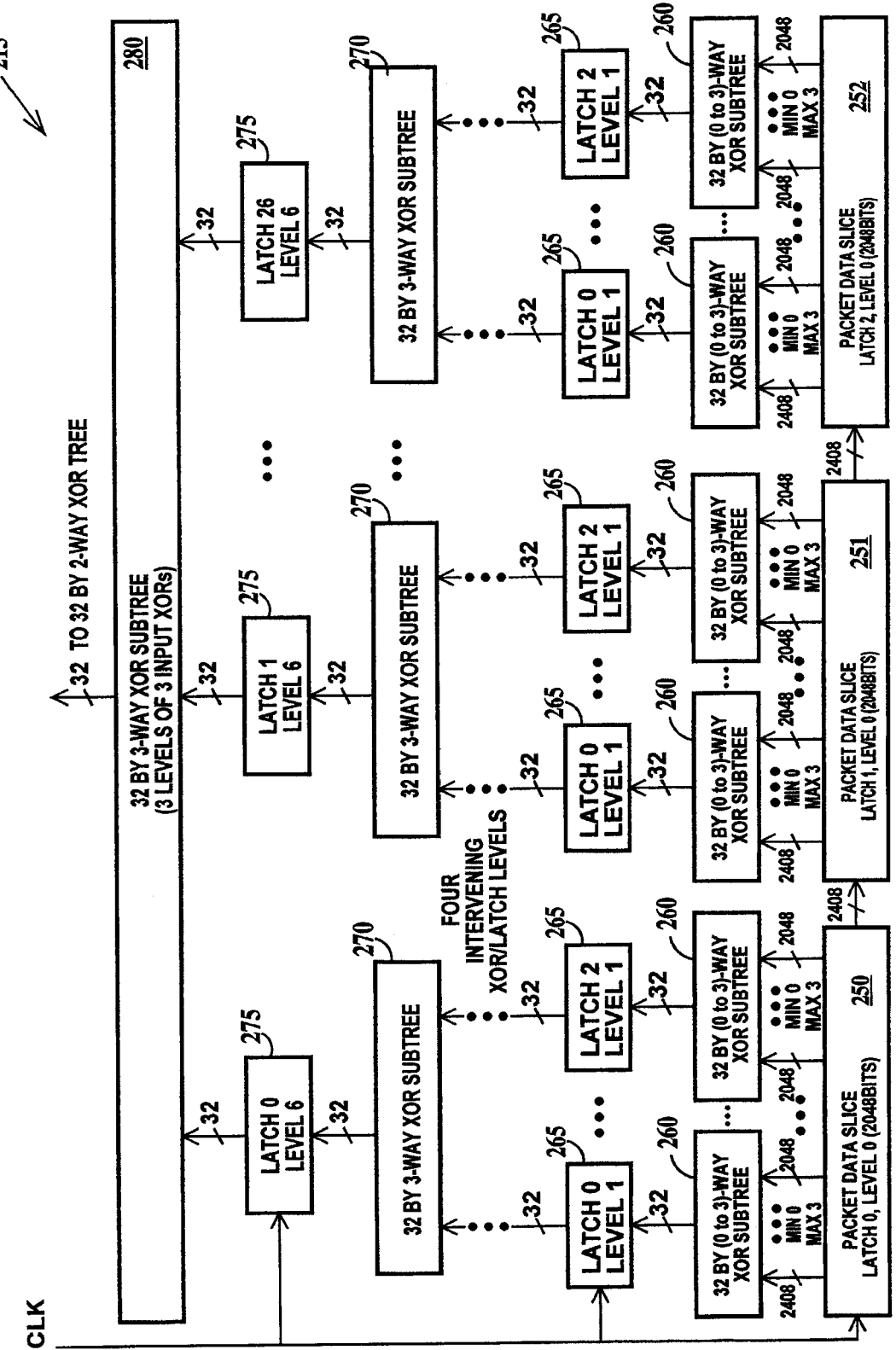
FIG. 10 is a schematic circuit diagram of a data partition of the CRC circuit of FIG. 8.

FIG. 10 is a schematic circuit diagram of data partition 215 of CRC circuit 200 of FIG. 8. In FIG. 10 data partition 215 includes three 2048-bit packet data slice latches 250, 251 and 252, three sets of 32 by (0 to 3)-way XOR subtrees 260 and corresponding 32-bit latches 265, intervening latch and XOR levels 2 through 5, three 32 by 3-way XOR subtrees 270 and corresponding 32-bit latches 275, and a 32 by 3-way XOR subtree 280. Latches 265 are partition level 1 latches, and latches 275 are partition level 7 latches, so there are eight latch levels in data partition 215.

Each XOR subtree 260 is connected to packet data slice latch 250, 252 or 252 by 0 to 3, 32-bit inputs (i. e. 96 inputs to each XOR subtree). Each of the 32 outputs of each XOR subtree 260 is connected to a different input of a corresponding latch 265. There need not be any particular relationship between a particular input of a particular XOR subtree 270 and a particular bit from packet data slice latch 250, 251 or 252. Each of the 32 outputs of each latch 265 of each set of 8 latches 265 is connected to a different input of a corresponding XOR subtree 270. Each of the 32 outputs of each latch 275 is connected to a different input of XOR subtree 280.

Data bits are moved from packet data slice latches 250, 251 and 252 through XOR subtrees 260 into latches 265 by clock signal CLK. Data bits are moved from latches 265 through XOR subtrees 270 and into latches 275 by clock signal CLK. Data bits are moved from latches 275, through XOR subtrees 280 into combinatorial XOR tree 220 (see FIG. 8) by clock signal CLK. The specific arrangement of XOR gates in XOR trees 260, 270 and 280 implements the CRC code and performs the actual CRC calculation.

Returning to FIG. 8, the structure of data partition 215 is determined by maximum delay through any level of remainder partition 210. For example, if the fastest level of remainder partition 210 is implemented using only 3-input and 2-input XOR gates and the largest CRC remainder expected is 1059-bits for each of latches 250, 251 and 252 then the maximum size of a subset of the 32-bit CRC remainder is 20-bits. The value 1059 is specific to the particular CRC calculation and number of bits processed per CLK cycle. The value 20 is also determined by the particular CRC calculation as are the particular the bits of the 32-bit input to remainder partition. When partitioning data partition 215, each level must include greater than a 3-input XOR operation. To process 2048-bits of data in one clock cycle, the worst-case single XOR operation must operate on 3*1059=3177 bits.

A data packet's 32-bit CRC remainder is calculated by initializing CRC 200 to a value of 0xFFFF_FFFF, and then processing the packet through the CRC circuit. Given the current CRC remainder value and a 2048-bit slice of the data packet, the next CRC remainder is calculated and then latched. The next CRC remainder value is calculated by performing a bit wise XOR operation on the two 32-bit outputs of data partition 215 and remainder partition 210. Each bit of the output of remainder partition 210 is calculated by performing an XOR operation over a subset of bits of the current CRC remainder value. Each bit of the output data partition 215 is calculated by performing an XOR operation over a subset of bits of the portion of packet data currently being processed.

The output of both remainder partition 210 and data partition 215 are the result of several levels of XOR operations. The topmost XOR operation of data partition 215 are the result of several levels of XOR operations. The topmost operation of data partition 215 (that performed by XOR subtree 280, se FIG. 10) is picked such that each output is fed by an XOR operation on three sets of inputs. The remaining, lower XOR operation level sizes (those performed by XOR subtrees 260 an by XOR subtrees 270, see FIG. 10) are picked arbitrarily to balance level sizes across the bottom two levels. There are 3216 levels total in data partition 215 ($3^7$=2187 level 0 levels, $3^6$=729 level 1 levels, $3^5$=245 level 2 levels, $2^4$=81 level 3 levels, $3^3$=27 level 4 levels, $3^2$=9 level 5 levels, 3 level 6 levels, and 1 level 7 level). The output of each sub-partition except for the last level, is latched. When the last 2048-bits of a data packet are processed, the next CRC remainder is the CRC value for the packet.

Figure 11:
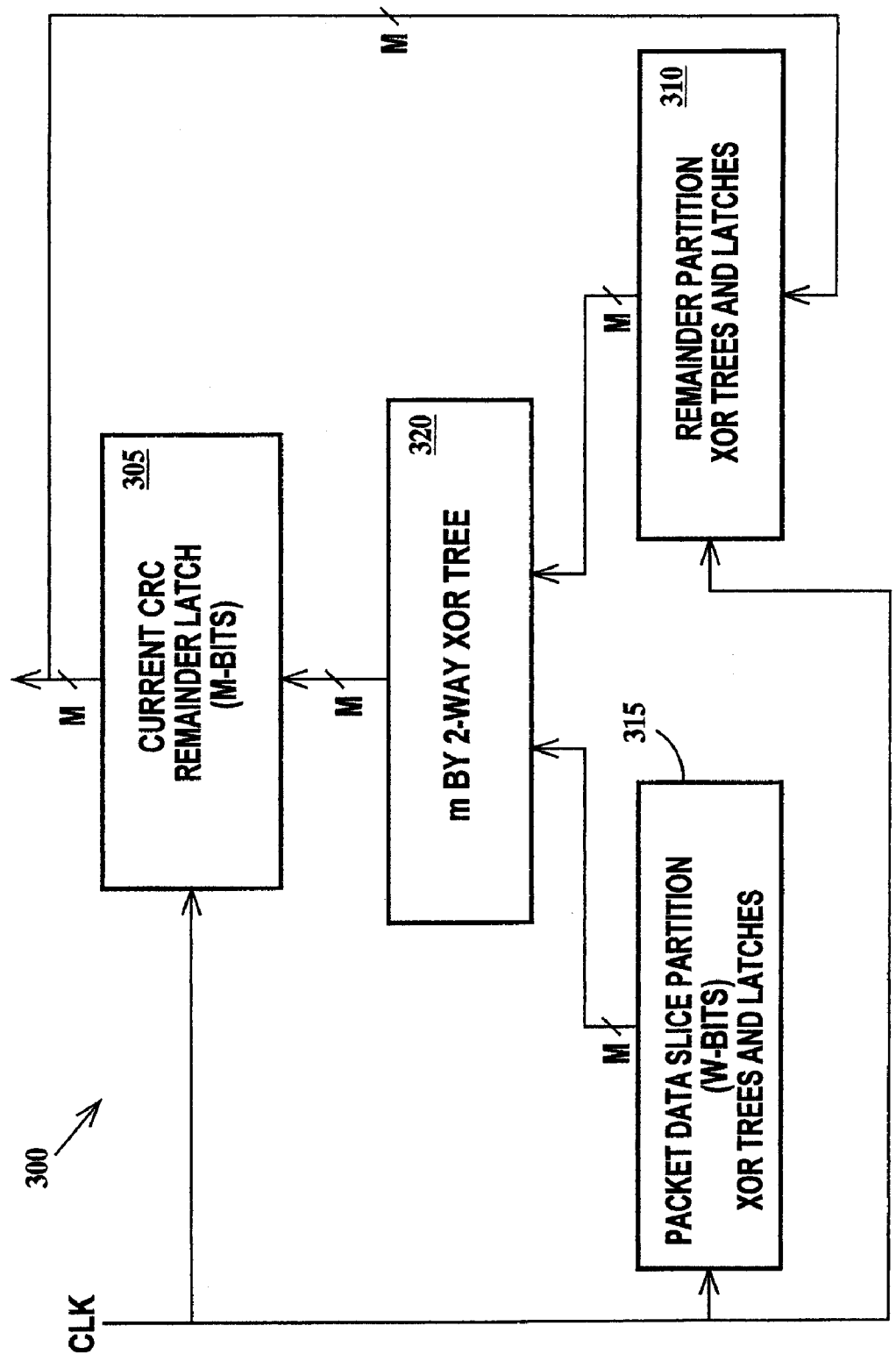
FIG. 11 is an exemplary generic scalable M-bit CRC circuit according to the present invention.

FIG. 11 is an exemplary generic scalable M-bit CRC circuit according to the present invention. In FIG. 11, a CRC circuit 300 includes an M-bit current CRC remainder latch 305, an M-bit remainder partition 310, a W-bit packet data slice partition 315 and an M by 2-way combinatorial XOR tree 320. The outputs of current CRC remainder latch 320 are connected to the inputs of remainder partition 310 by an M-bit bus, each bit connected to a different input. The outputs of remainder partition 310 are connected to a first set of inputs of combinatorial XOR tree 320 by an M-bit bus, each bit connected to a different input. The outputs of packet data slice partition's 315 are connected a second set of inputs of combinatorial XOR tree 320 by an M-bit bus, each bit connected to a different input. The outputs of combinatorial XOR tree 320 are connected to the inputs of current CRC remainder latch 305 by an M-bit bus, each bit connected to a different input.

Figure 12:
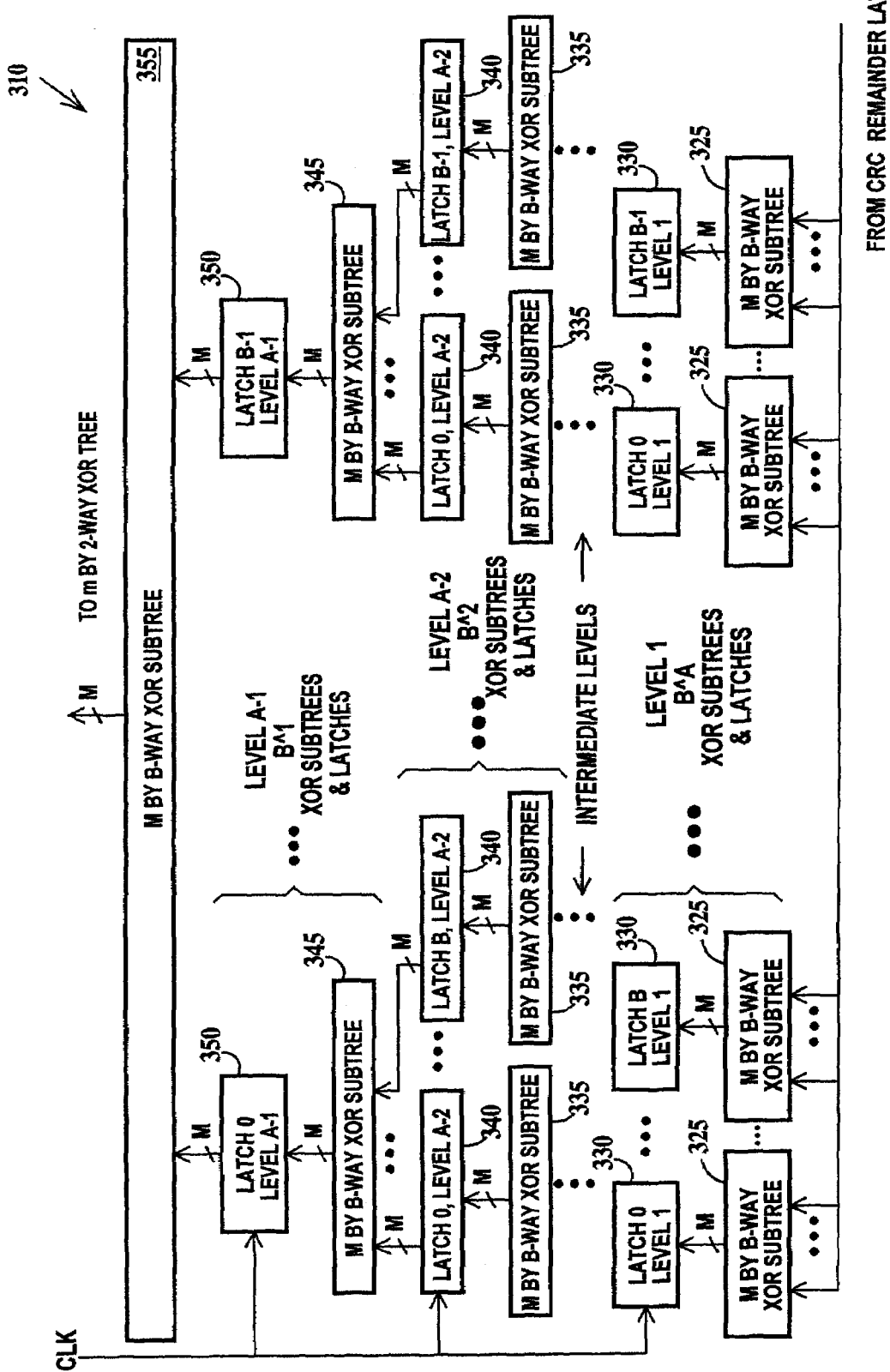
FIG. 12 is a schematic circuit diagram of a remainder partition of the CRC circuit of FIG. 11.

FIG. 12 is a schematic circuit diagram of remainder partition 325 of CRC circuit 300 of FIG. 11. In FIG. 12, remainder partition 310 includes, $B^4$ of M by B-way XOR subtrees 325 in the lowest remainder of XOR subtree level and corresponding M-bit latches 330, intermediate levels of M by B-way XOR subtrees and corresponding latches (not shown), $B^2$ of M by B-way XOR subtrees 335 and corresponding M-bit latches 340, B of M by B-way XOR subtrees 345 and corresponding M-bit latches 350, and an M by B way XOR subtree 355 in the highest remainder XOR subtree level. A is the number of cascaded XOR levels in the remainder partition, B is the maximum number of XOR operations to be performed in a single XOR level and M is maximum number of bits in a CRC remainder. Latches 330 are partition level 1 latches, latches 330 are level (A−1)

latches and latches 350 are level A latches, so there are A partition levels in remainder partition 310.

Each XOR subtree 325 is connected to remainder latch 305 by variable numbers of M-bit input. Each of the M outputs of each XOR subtree 325 is connected to a different input of a corresponding latch 330. There need not be any particular relationship between a particular input of a particular XOR subtree 325 and a particular bit from packet data slice latch 305 (see FIG. 11). After progressing through intermediate partition levels, each of the M outputs of each of XOR subtrees 335 is connected to a different input of corresponding latches 340. Each of the M outputs of each latch 340 is connected to a different input of corresponding XOR subtrees 345. Each of the M outputs of XOR subtrees 345 are connected a different input of corresponding latches 350. Each of the M inputs of latches 350 is connected to different inputs of XOR subtree 355. Each of the M outputs of XOR subtree 355 is connected to a different input of a first M member subset of the 2M inputs of combinatorial XOR subtree 305 (see FIG. 11).

Remainder bits are moved from CRC remainder latch 305 (See FIG. 11) through the level levels by a clock signal CLK applied to the latches within each partition level.

The structure of remainder partition 310 is determined by A, I, the maximum size of a subset of the M-bit CRC remainder and B. The value I is specific to the particular CRC calculation and number of bits processed per CLK cycle. A also satisfies the relationship that A is the smallest whole positive number greater than $\log_B I$.

Figure 13:
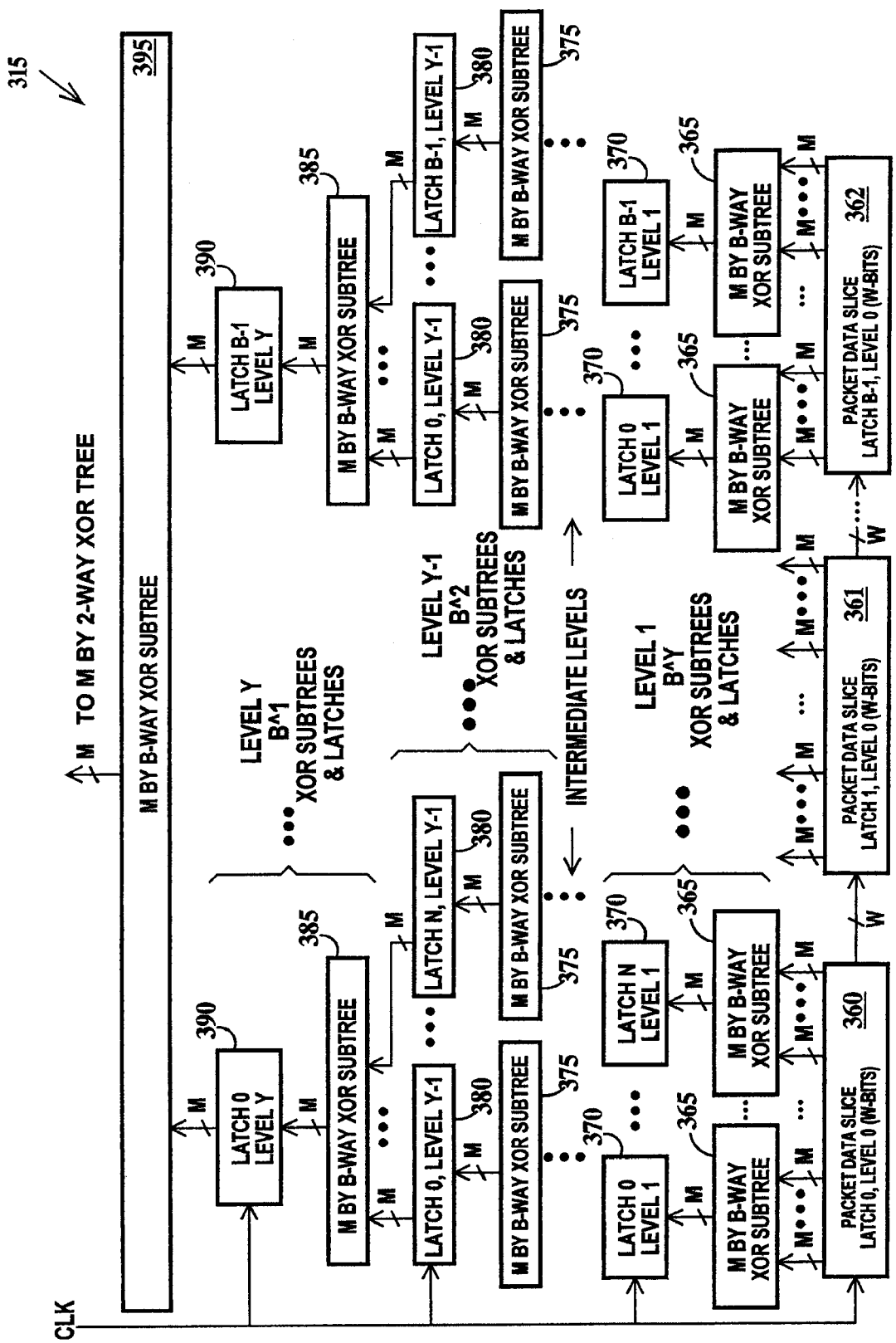
FIG. 13 is a schematic circuit diagram of a data partition of the CRC circuit of FIG. 11.

FIG. 13 is a schematic circuit diagram of data partition 370 of CRC circuit 300 of FIG. 11. In FIG. 13, data partition 370 includes W-bit packet data slice latches 360 through 361 and 362 through 362, $B^Y$ of M by B-way XOR subtrees 365 in the lowest data XOR subtree level and corresponding M-bit latches 370 (B was defined supra and Y and M are defined infra), intermediate levels of M by B-way XOR subtrees and corresponding latches (not shown), $B^2$ of M by B-way XOR subtrees 375 and corresponding M-bit latches 380, B of M by B-way XOR subtrees 385 and corresponding M-bit latches 390, and, an M by B-way XOR subtree 395 in the highest data XOR subtree level. Packet data slice latches 360 through 361 and 361 through 362 are partition level 0 latch. Latches 370 are partition level 1 latches, latches 380 are partition level (Y-1) latches and latches 390 are partition level Y latches, so there are Y partition levels in data partition 315.

Each XOR subtree 365 is connected to packet data slice latches 360 through 361 or 361 through 362. Each of the M outputs of each XOR subtree 365 is connected to a different input of a corresponding latch 370. There need not be any particular relationship between a particular input of a particular XOR subtree 365 and a particular bit from packet data slice latch 360. After progressing through intermediate partition levels, each of the M outputs of each of XOR subtrees 375 is connected to a different input of corresponding latches 380. Each of the M outputs of each latch 380 is connected to a different input of corresponding XOR subtrees 385. Each of the M outputs of XOR subtrees 385 are connected to a different input of corresponding latches 390. Each of the M outputs of latches 390 is connected to different inputs of XOR subtree 395.

Data bits are moved from packet data slice latch 360 through the (Y-1) partition levels by a clock signal CLK applied to the latches within each partition level. The specific arrangement of XOR gates in the XOR subtrees of the various partition levels of data partition 315 and XOR subtrees 365 and 375 through 385 and 395 implements the CRC code and performs the actual CRC calculation.

Returning to FIG. 11, the structure of data partition 315 is determined by maximum delay through the any XOR subtree of remainder partition 310. The maximum number of inputs of any XOR subtree in CRC circuit 300 is B.

A data packet's M-bit CRC remainder is calculated by initializing CRC circuit 300 to a value of −1, and then processing the packet through the CRC circuit. Given the current CRC remainder value and a W-bit slice of the data packet, the next CRC remainder is calculated and then latched. The next CRC remainder value is calculated by performing a bit wise XOR operation on the two M-bit outputs of XOR remainder partition 310 and data partition 315. Each bit of the output of remainder partition 310 is calculated by performing an XOR operation over a subset of bits of the current CRC remainder value. Each bit of the output of data partition 315 is calculated by performing an XOR operation over a subset of bits of the portion of packet data currently being processed.

The outputs of both of remainder partition 310 and data partition 315 are the results of several levels or partitions of XOR operations performed as illustrated in FIGS. 11 and 12. The topmost XOR operation of data partition 315 (that performed by XOR subtree 395) is picked such that each output is fed by an XOR operation on N-inputs. The output of each level is latched. When the last W-bits of a data packet are processed, the next CRC remainder is the CRC value for the packet.

Figure 14:
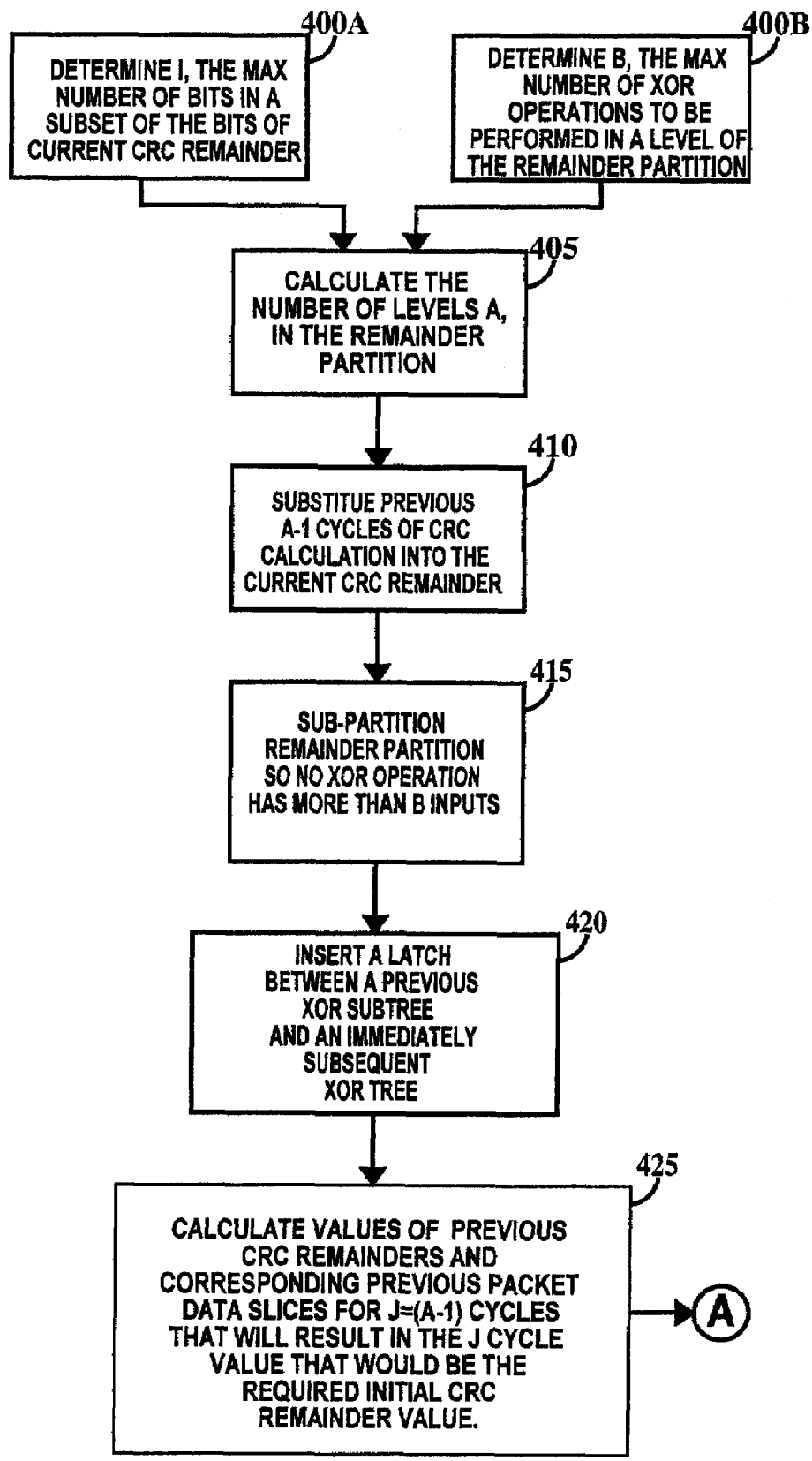
FIG. 14 is a flowchart of the method of designing a remainder partition of a CRC circuit according to the present invention.

FIG. 14 is a flowchart of the method of designing a remainder partition of a CRC circuit according to the present invention. In step 400A, I, the largest number of bits in a subset of bits of the current CRC remainder to be processed is determined. In step 400B, B, the maximum number of XOR operations to be performed in a single level of the remainder partition. In step 405, the number of levels (A) in the remainder partition are calculated using the formula A=smallest whole positive number greater than $\log_B I$. In step 410, the previous A−1 cycles of CRC calculation are substituted into the current CRC remainder. This is a calculation in terms of the current packet data slice and previous A−1 data packet slices and the CRC remainder value from cycle j−(A−1). In step 415, the CRC remainder partition is leveled so no XOR operation in the remainder partition has more than B inputs. In step 420, a latch is inserted between the output of previous XOR subtrees and subsequent XOR subtrees of the remainder partition. In step 425, the values previous CRC remainders and corresponding previous packet data slices for j=(a−1) cycles that will result in the j cycle value that would be the required initial CRC remainder value are calculated.

Figure 15:
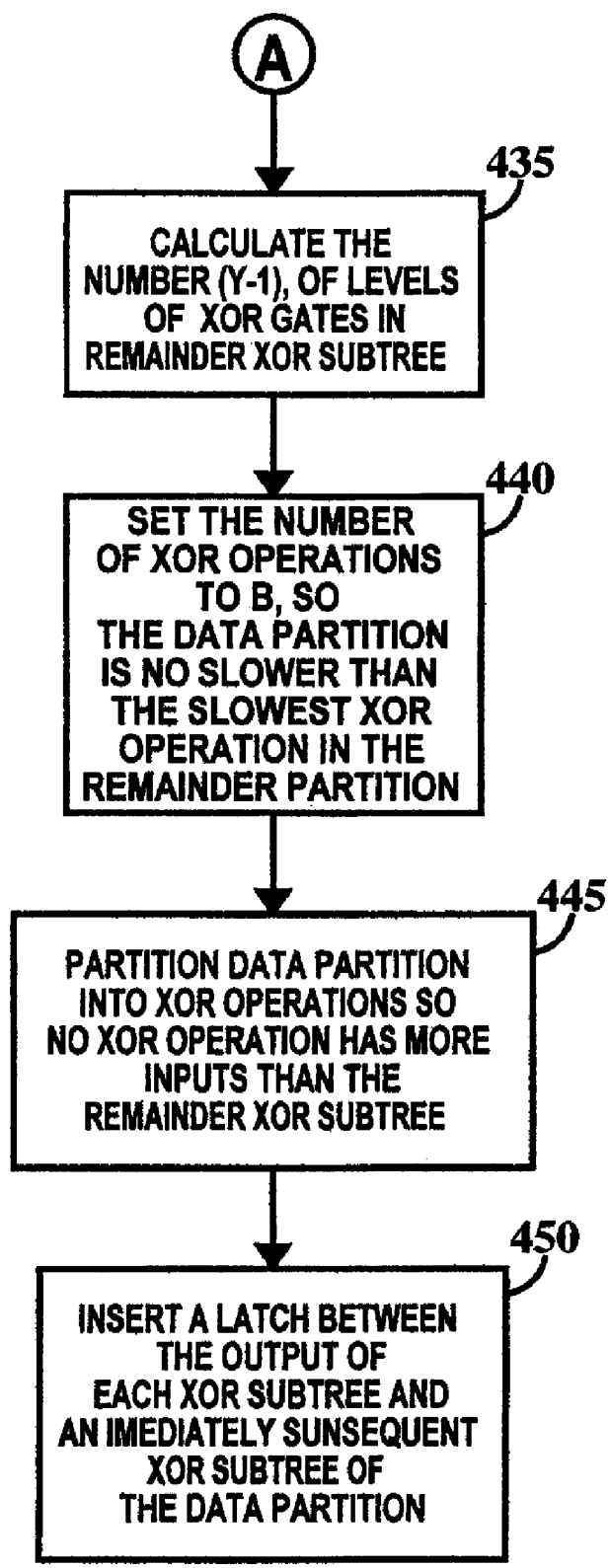
FIG. 15 is a flowchart of the method of designing a data partition of a CRC circuit according to the present invention.

The design of the data partition occurs after the design of the remainder partition through connector A and is illustrated in FIG. 15 and described infra.

FIG. 15 is a flowchart of the method of designing a data partition of a CRC circuit according to the present invention and is a continuation through connector A of the flowchart of FIG. 14. In step 435, the largest number of XOR gate levels (Y−1), in the data partition is calculated using the formula that (Y−1) is equal to the smallest whole positive number greater than the log to the base B of B times the largest number of bits J of a subset of the W-bits of the packet data slice latch. In step 440, the largest number of XOR operations in the data partition is set to B so no XOR operation of the data partition no slower than the slowest XOR operation performed by the remainder partition. In step 445, the data packet partition is partitioned into XOR subtrees such that no XOR subtree of the data packet slice XOR subtree has more inputs then the number of inputs remainder partition. This number is B. In step 450, the XOR output of every XOR subtree in the data partition is latched except the topmost XOR subtree.

Thus, the present invention provides a more efficient CRC circuit than presently available.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

The invention claimed is:

1. A circuit, comprising:
   multiple packet data slice latches each having W-bits where W is a positive integer, each packet data slice latch having inputs and outputs, said packet data slice latches connected in series from a first to a last packet data slice latch, outputs of a previous packet data slice latch connected to inputs of an immediately subsequent packet data slice latch;
   a data partition comprising multiple data XOR subtree levels and having data latches between said data XOR subtree levels, said data partition having inputs and outputs, said outputs of each packet data slice latch connected to corresponding inputs of said data partition;
   a remainder partition comprising multiple remainder XOR subtree levels and having remainder latches between said remainder XOR subtree levels, said remainder partition having inputs and outputs;
   a combinatorial XOR tree having inputs and outputs, the outputs of said remainder partition and the outputs of said data partition connected to corresponding inputs of said combinatorial XOR tree; and
   a current cyclic redundancy check (CRC) remainder latch having M-bits where M is a positive integer and having inputs and outputs the outputs of said combinatorial XOR tree connected to corresponding inputs of said current CRC remainder latch and the outputs of said current CRC remainder latch connected to corresponding inputs of said remainder partition.

2. The circuit of claim 1, wherein:
   each output of each of said packet data slice latches is connected to a corresponding input of a lowest XOR subtree level of said data partition and each intermediate XOR subtree level of said data partition is connected between an immediately higher XOR subtree level of said data partition through an intervening latch level and an immediately lower XOR subtree level of said data partition through an intervening latch level; and
   each output of said CRC remainder latch is connected to a corresponding input of a lowest XOR subtree level of said remainder partition and each intermediate XOR subtree level of said remainder partition is connected between an immediately higher XOR subtree level of said remainder partition through an intervening latch level and an immediately lower XOR subtree level of said remainder partition through an intervening latch level.

3. The circuit of claim 1, wherein said packet data slice latches, all said data latches in said data partition, all said remainder latches in said remainder partition and said current CRC remainder latch are responsive to the same clock signal.

4. The circuit of claim 1, wherein B is a positive integer and is the maximum number of XOR operations to be performed in a single remainder XOR subtree level of said remainder partition and A is a number of remainder XOR subtree levels of said remainder partition and A is also the smallest positive integer greater than the log to the base B of the largest number of bits I of a subset of the M-bits of said CRC remainder latch.

5. The circuit of claim 1, wherein each packet data slice latches sequential and different data slices.

6. The circuit of claim 5, wherein the maximum number of inputs to any data XOR subtree in any data XOR subtree level of said data partition is B, where B is a positive integer.

7. The circuit of claim 6, wherein the number of levels of said data partition is the smallest positive number greater than the log to the base B of B times J, where J is the largest number of bits of a subset of the W-bits of said packet data slice latch.

8. The circuit of claim 7, wherein W=2048, I=20, J=1059, A=3 and B=3.

9. The circuit of claim 1, wherein:
   a number of data XOR subtree levels in said data partition is equal to a number of remainder XOR subtree levels in said remainder partition.

10. The circuit of claim 1, wherein the slowest data XOR subtree level of said data partition is no slower than the slowest remainder XOR subtree level of said remainder partition.

11. A method for performing a cyclic redundancy check, comprising:
    providing multiple packet data slice latches each having W-bits where W is a positive integer and each packet data slice latch having inputs and outputs;
    connecting said packet data slice latches in series from a first to a last packet data slice latch, outputs of a previous packet data slice latch connected to inputs of an immediately subsequent packet data slice latch;
    providing a data partition comprising multiple data XOR subtree levels and having data latches between said data XOR subtree levels, said data partition having inputs and outputs;
    connecting said outputs of each packet data slice latch to corresponding inputs of said data partition;
    providing a remainder partition comprising multiple remainder XOR subtree levels and having remainder latches between said remainder XOR subtree levels, said remainder partition having inputs and outputs;
    providing a combinatorial XOR tree having inputs and outputs;
    connecting said outputs of said remainder partition and the outputs of said data partition to the inputs of said combinatorial XOR tree;
    providing a current cyclic redundancy check (CRC) remainder latch having M-bits where M is a positive integer and having inputs and outputs;
    connecting the output of said combinatorial XOR tree to the inputs of said current CRC remainder latch and the outputs of said current CRC remainder latch to the inputs of said remainder partition; and
    presenting a data packet to said inputs of said packet data slice latches and outputting a CRC remainder at said outputs of said CRC remainder latch.

12. The method of claim 11, wherein:

each output of each of said packet data slice latches is connected to a corresponding input of a lowest XOR subtree level of said data partition and each intermediate XOR subtree level of said data partition is connected between an immediately higher XOR subtree level of said data partition through an intervening latch level and an immediately lower XOR subtree level of said data partition through an intervening latch level; and each output of said CRC remainder latch is connected to a corresponding input of a lowest XOR subtree level of said remainder partition and each intermediate XOR subtree level of said remainder partition is connected between an immediately higher XOR subtree level of said remainder partition through an intervening latch level and an immediately lower XOR subtree level of said remainder partition through an intervening latch level.

13. The method of claim 11, wherein said packet data slice latches, all said data latches in said data partition, all said remainder latches in said remainder partition and said current CRC remainder latch are responsive to the same clock signal.

14. The method of claim 11, wherein B is a positive integer and is the maximum number of XOR operations to be performed in a single remainder XOR subtree level of said remainder partition and A is a number of remainder XOR subtree levels of said remainder partition and A is also the smallest positive integer greater than the log to the base B of the largest number of bits I of a subset of the M-bits of said CRC remainder latch.

15. The method of claim 11, wherein each packet data slice latches sequential and different data slices.

16. The method of claim 15, wherein the maximum number of inputs to any data XOR subtree in any data XOR subtree level of said data partition is B, where B is a positive integer.

17. The method of claim 16, wherein the number of levels of said data partition is the smallest positive number greater than the log to the base B of B times J, where J is the largest number of bits of a subset of the W-bits of said packet data slice latch.

18. The method of claim 17, wherein W=2048, I=20, J=1059, A=3 and B=3.

19. The method of claim 11, wherein a number of XOR operations in said data partition is equal to a number of XOR operations in said remainder partition.

20. The method of claim 11, wherein the slowest data XOR subtree level of said data partition is no slower than the slowest remainder XOR subtree level of said remainder partition.

21. A method of designing a circuit, the method comprising:

(a) providing a cyclic redundancy check (CRC) circuit design for a current CRC remainder, comprising:

outputs of a packet data slice latch connected to inputs of a data XOR tree;

outputs of a current CRC remainder latch connected to inputs of a remainder XOR tree; and outputs of said data XOR tree and outputs of said remainder XOR tree coupled to corresponding inputs of said current CRC remainder latch through a combinatorial XOR tree;

(b) substituting a previous CRC cycle data and corresponding previous CRC remainder for said current CRC remainder or for a previously substituted CRC remainder and adding an additional packet data slice latch, an additional CRC remainder latch, an additional data XOR tree, an additional remainder XOR tree and an additional combinatorial XOR tree to said CRC circuit design without altering the a CRC remainder result of said CRC circuit design;

(c) partitioning all packet data slice latches and all data XOR trees into a data partition and all additional current CRC remainder latches and all remainder XOR trees into a remainder partition;

(d) combining all remainder XOR trees into a single remainder XOR tree and combining all data XOR trees into a single data XOR tree;

(e) repeating steps (b) through (c) a predetermined number of times; and (f) distributing said single remainder XOR tree in said remainder partition over two or more remainder XOR subtree levels, distributing all additional CRC remainder latches over one or more remainder latch levels, distributing said single data XOR trees in said data partition over two or more data XOR subtree levels.

22. The method of claim 21, wherein step (f) further includes placing remainder latch levels between each remainder XOR subtree level of said remainder partition and a placing a data latch level between each data XOR subtree level of said data partition.

23. The method of claim 21, wherein a number of XOR operations in said data partition is equal to a number of XOR operations in said remainder partition.

24. The method of claim 21, wherein step (f) further includes selecting each data XOR subtree to be no slower than the slowest remainder XOR subtree.

25. The method of claim 21, further including:

(g) connecting a clock input of each data latch in said data partition, each remainder latch in said remainder partition, said current CRC remainder latch and said packet data slice latch to a same clock input pin.

26. A method of designing a cyclic redundancy check circuit, the method comprising:

(a) distributing a current cyclic redundancy check (CRC) remainder XOR calculation of a redundancy check circuit into a remainder partition comprising multiple levels of remainder XOR subtrees and having remainder latches between said levels of remainder XOR subtrees; and (b) distributing a packet data slice XOR function of said redundancy check circuit into a data partition comprising multiple levels of data XOR subtrees and having data latches between said levels of data XOR subtrees; and (c) storing a design of said cyclic redundancy check circuit based on steps (a) and (b) on a computer readable storage media.

27. The method of claim 26 wherein step (a) includes:

(a1) determining I, a largest number of bits of a subset of a number of bits of a current CRC remainder required to generate an output on said remainder partition;

(a2) determining B, a maximum number of XOR operations to be performed in a single remainder XOR subtree level of said remainder partition;

(a3) calculating A, a number of XOR subtree levels in said remainder partition;

(a4) substituting (A−1) cycles of CRC operation into a current CRC remainder calculation;

(a5) distributing said current CRC remainder XOR calculation among remainder XOR subtrees of said remainder partition such that no remainder XOR subtree level has more than B inputs; and (a6) inserting a remainder latch level between each remainder XOR subtree level.

28. The method of claim 27, wherein step (b) includes:
(b1) distributing said packet data slice XOR function among data XOR subtrees of said data partition such that no data XOR subtree level has more than B inputs; and
(b2) inserting a data latch level between each data XOR subtree level of said data partition.

29. The method of claim 28, wherein a number of levels of said packet data slice XOR partition is the smallest whole positive number greater than the log to the base B of B times, where J is the number of bits in a largest data slice said circuit is designed to handle.

30. The method of claim 26, further including:
(a7) calculating values of previous CRC remainders and corresponding previous packet data slices for $j=(A-1)$ cycles that will result in a $j=0$ cycle value that will be a used as an initial CRC remainder value.

* * * * *